United States Patent
Takeuchi et al.

(10) Patent No.: US 8,785,775 B2
(45) Date of Patent: Jul. 22, 2014

(54) WATERPROOF BOX

(75) Inventors: Kunihiko Takeuchi, Kakegawa (JP); Hiroaki Yamada, Kakegawa (JP)

(73) Assignee: Yazaki Corporation, Tokyo (JP)

(*) Notice: Subject to any disclaimer, the term of this patent is extended or adjusted under 35 U.S.C. 154(b) by 8 days.

(21) Appl. No.: 13/376,959

(22) PCT Filed: Jun. 8, 2010

(86) PCT No.: PCT/JP2010/059702
§ 371 (c)(1),
(2), (4) Date: Dec. 8, 2011

(87) PCT Pub. No.: WO2010/143631
PCT Pub. Date: Dec. 16, 2010

(65) Prior Publication Data
US 2012/0073851 A1    Mar. 29, 2012

(30) Foreign Application Priority Data

Jun. 11, 2009    (JP) .................................. 2009-140260

(51) Int. Cl.
*H02G 3/14*    (2006.01)

(52) U.S. Cl.
USPC ................. 174/67; 174/66; 174/50; 220/242; 248/906; 439/535

(58) Field of Classification Search
CPC ............ H02G 3/14; H02G 3/16; H02G 3/088
USPC ............... 174/66, 67, 50; 220/241, 242, 4.02; 439/535; 248/906
See application file for complete search history.

(56) References Cited

U.S. PATENT DOCUMENTS 7,077,281 B2 * 7/2006 Sato et al. ........................ 220/3.8
8,153,895 B2 * 4/2012 Drane .............................. 174/66

FOREIGN PATENT DOCUMENTS

| CH | 676627 A5 | 2/1991 |
|---|---|---|
| DE | 8714329.1 | 1/1988 |
| JP | 09-216648 A | 8/1997 |
| JP | 2000-004521 A | 1/2000 |
| JP | 2001-072116 A | 3/2001 |
| JP | 2001-231128 A | 8/2001 |

OTHER PUBLICATIONS

International Search Report dated Sep. 7, 2010, issued for PCT/JP2010/059702.
European Search Report dated Apr. 2, 2014 in connection with European Application No. 10786162.7.

* cited by examiner

*Primary Examiner* — Dhirubhai R Patel
(74) *Attorney, Agent, or Firm* — Edwards Wildman Palmer LLP; James E. Armstrong, IV; Carolina E. Save

(57) ABSTRACT

The present invention provides a waterproof box which can improve water performance and work efficiency, and can reduce space. When washing water hits in the lower surface (33h) of first waterproof portion (33) of an upper cover (15), spay is generated. At this time, an outer surface (30b), which is formed in a tapered shape, of first waterproof portion (30) abuts on an inner surface (33g), which is formed in a tapered shape, of the first waterproof portion (33). Further, the outer surface (30b) engages with the inner surface (33g). As a result, the inlet of a minute path (27) is closed. Even if water leaks, force of the water is reduced because the water enters in a groove (33b or 35a). The water in which force of the water is reduced falls down.

3 Claims, 12 Drawing Sheets

WATERPROOF BOX

CROSS REFERENCE TO RELATED APPLICATIONS

This application is related to three co-pending applications, all entitled, "WATERPROOF BOX" filed concurrently herewith, in the names of Kunihiko TAKEUCHI and Hiroaki YAMADA as a national stage application of International Application No. PCT/JP2010/059703, filed Jun. 8, 2010; in the names of Sunsoku I and Yasuhito SUZUKI as a national stage application of International Application No. PCT/JP2010/059750, filed Jun. 9, 2010; and in the names of Kouki SATOH and Noriaki AKAMINE as a national stage application of International Application No. PCT/JP2010/059751, filed Jun. 9, 2010; which co-pending applications are assigned to the assignee of the instant application and also incorporated by reference herein.

TECHNICAL FIELD

The present invention relates to a waterproof box waterproofed by overlapping a box main body side waterproof structure with a cover side waterproof structure.

BACKGROUND OF THE INVENTION

For example, an electric junction box installed in an engine room of a vehicle has connection parts of a wiring harness, electric parts such as a relay or fuse, and electric component such as an electronic control unit. It is required to keep liquid such as water away from all parts of the electric junction box when the vehicle runs in the rain or the engine room is washed with high-pressure. For this reason, the electric junction box is constructed with a waterproofed box main body receiving the electric parts and the like, and a waterproofed cover for covering an upper opening of the box main body. The electric junction box has a function as a waterproof box.

For the waterproof box, various waterproof types are known. For example, one type is waterproofed by sandwiching a packing between a waterproof structure arranged in the box main body and a waterproof structure arranged in the cover (see Patent Document 1). Further, another type is waterproofed by overlapping the waterproof structure of the box main body with the waterproof structure of the cover without using the packing (see Patent Document 2).

In the waterproof box of type using the packing, since the packing sandwiched between the waterproof structures covers a gap, waterproof performance can be increased. However, there is a problem such that the parts of the packing are increased, and as a result costs are increased. Furthermore, process for installing the packing is increased. For this reason, in recent years, the waterproof box of type not using the packing is used.

The waterproof box of type not using the packing disclosed in the Patent Document 2 includes a box main body having an upper opening and a cover for covering the upper opening of the box main body. The waterproof box is waterproofed by overlapping waterproof structures which are provided in a box body and a cover joint respectively. More specifically, the box main body side waterproof structure has a circular waterproof projection arranged around the tip of the peripheral wall of the box main body. The cover side waterproof structure has a circular waterproof dent arranged around the tip of the cover peripheral wall of the cover.

In the above configuration and construction, the cover is arranged in the upper side of the upper opening of the box main body. And then, the cover is moved straight down, and the waterproof structures are overlapped. At this time, the waterproof projection is inserted in the waterproof dent. Further, a main body lock arranged in the waterproof structure of the box main body is locked on a U-shaped cover lock arranged in the cover waterproof structure. Thereby the box main body and the cover are locked, and become the locked state. The main body lock and the cover lock are provided in at least two positions which is located at the right and left sides of the waterproof box (or at the back and forth sides thereof). The two positions are separately located.

PRIOR ART DOCUMENT

Patent Document

Patent Document 1: Japanese Patent Publication Application No. 2001-72116
Patent Document 2: Japanese Patent Publication Application No. H09-216648

DISCLOSURE OF THE INVENTION

Problem to be Solved by the Invention

In the waterproof box of type not using the packing, there is a problem such as the following. More specifically, when injection water pressure with high-pressure washing is high, the washing water injected toward the waterproof box hits in the peripheral wall of the box main body. Thereafter, the washing water is increased along the peripheral wall, and passes through a minute gap between the overlapped waterproof structures. As a result, liquid such as water enters into the inside of the waterproof box.

In the Patent document 2, the inner walls are respectively arranged inside waterproof structures of the peripheral wall and the cover peripheral wall. Therefore, although water enters into the inside in the above condition, electric components are prevented from getting wet by the inner wall. However, it is difficult to arrange the inner wall in various waterproof boxes because the inner wall can not be partly arranged therein. Therefore, it is required to provide effective measures against waterproof structures of the box main body and the cover.

Recently, an aluminum electric wire is arranged in the waterproof box. The connection of the aluminum electric wire does not like water adhesion. For this reason, the need for preventing water adhesion is increasing.

Also, in the waterproof box of type not using the packing, there is a problem such as the following. More specifically, when the locked state of the main body lock and the cover lock is canceled, at least two positions respectively have to be canceled. Its work is troublesome work for a worker or user. Furthermore, when the locked states in two positions are canceled respectively and then the cover is removed, it is necessary to maximize the space which is able to use both hands in the upper side of the waterproof box. Also, it goes without saying that waterproof performance has to be maintained so as to solve those problems.

Accordingly, an object of the present invention is to provide a waterproof box which can improve waterproof performance and work, and can save space.

SUMMARY OF THE INVENTION

Means for Solving the Problem

In order to attain the above-described objectives, according to a first aspect of the present invention, a waterproof box includes a box main body having a peripheral wall and receiving components which do not like water inside of the peripheral wall, a cover having a cover peripheral wall and covering an opening of the edges of the peripheral wall of the box main body, a main body side waterproof structure arranged in the peripheral wall of the box main body, and a cover side waterproof structure arranged in the cover peripheral wall of the cover. The main body side waterproof structure is overlapped with the cover side waterproof structure so as to waterproof, and opposed surfaces by overlapping are a main body side matching surface and a cover side matching surface, respectively. Further, the main body side matching surface and the cover side matching surface are formed as at least a pair of tapered surfaces which are abutted and fit when the cover is moved in a direction removing the box main body.

According to the present invention having the above feature, when the cover fits up by water pressure, the tapered surfaces are abut and fit each other. A minute path generated between the main body side matching surface and the cover side matching surface, in other words, a minute path being water flow path, is covered by fitting the tapered surfaces. As a result, pass (ingress) of water is prevented.

According to a second aspect of the present invention in the context of the first aspect thereof, rotation supporting points are arranged in the main body side waterproof structure and the cover side waterproof structure respectively so that the cover is rotatably and removably moved against the box main body.

According to the present invention having the above feature, the cover is rotatably moved in the rotation supporting point. By rotating the rotation supporting point, the cover can cover the opening of the box main body and be removably moved. Further, lock structure, in which the box main body and the cover are locked, is provided in a position opposite to the position arranging the rotation supporting point. That is, the lock structure is arranged in one position. Thus, cancel of the lock is performed with one position. According to the present invention, the cover can be attached and removed with one hand (one action).

Effects of the Invention

According to the first aspect of the present invention described above, since the main body side matching surface and the cover side matching surface are formed as at least a pair of tapered surfaces, pass of the water can be prevented by fitting the tapered surfaces. Thus, according to the present invention, waterproof performance can be improved than ever before.

According to the second aspect of the present invention described above, since the rotation supporting point is arranged, the cover can be attached and removed with one hand. Thus, according to the present invention, work can be efficiently performed. Furthermore, since the cover is attached and removed with one hand, it is not required to maintain large space which is able to use both hands in the upper side of the cover. Thus, space can be saved.

DESCRIPTION OF THE PREFERRED EMBODIMENT

Figure 1:
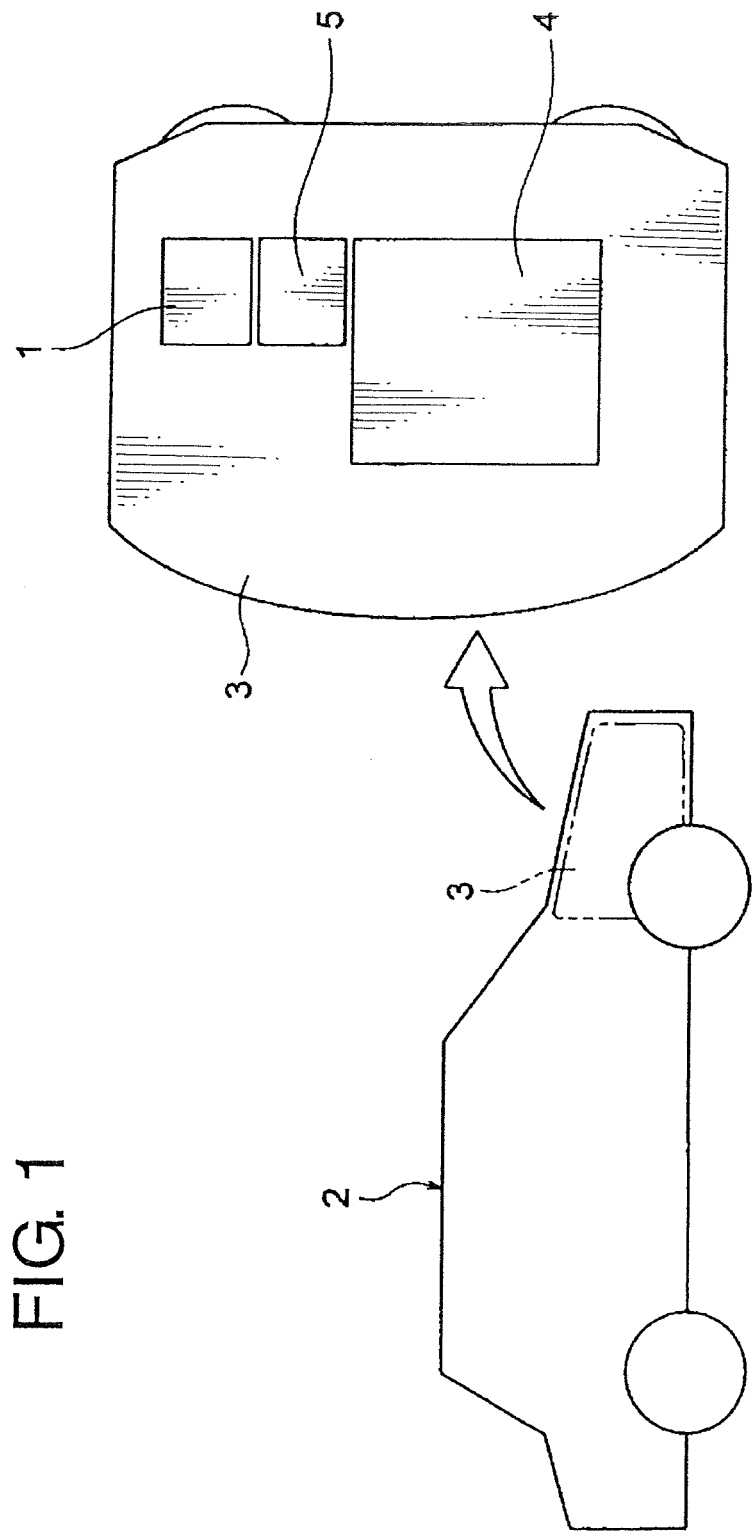
FIG. 1 is an exemplary diagram showing an example of installation of an electric junction box including a waterproof box of the present invention.
Figure 2:
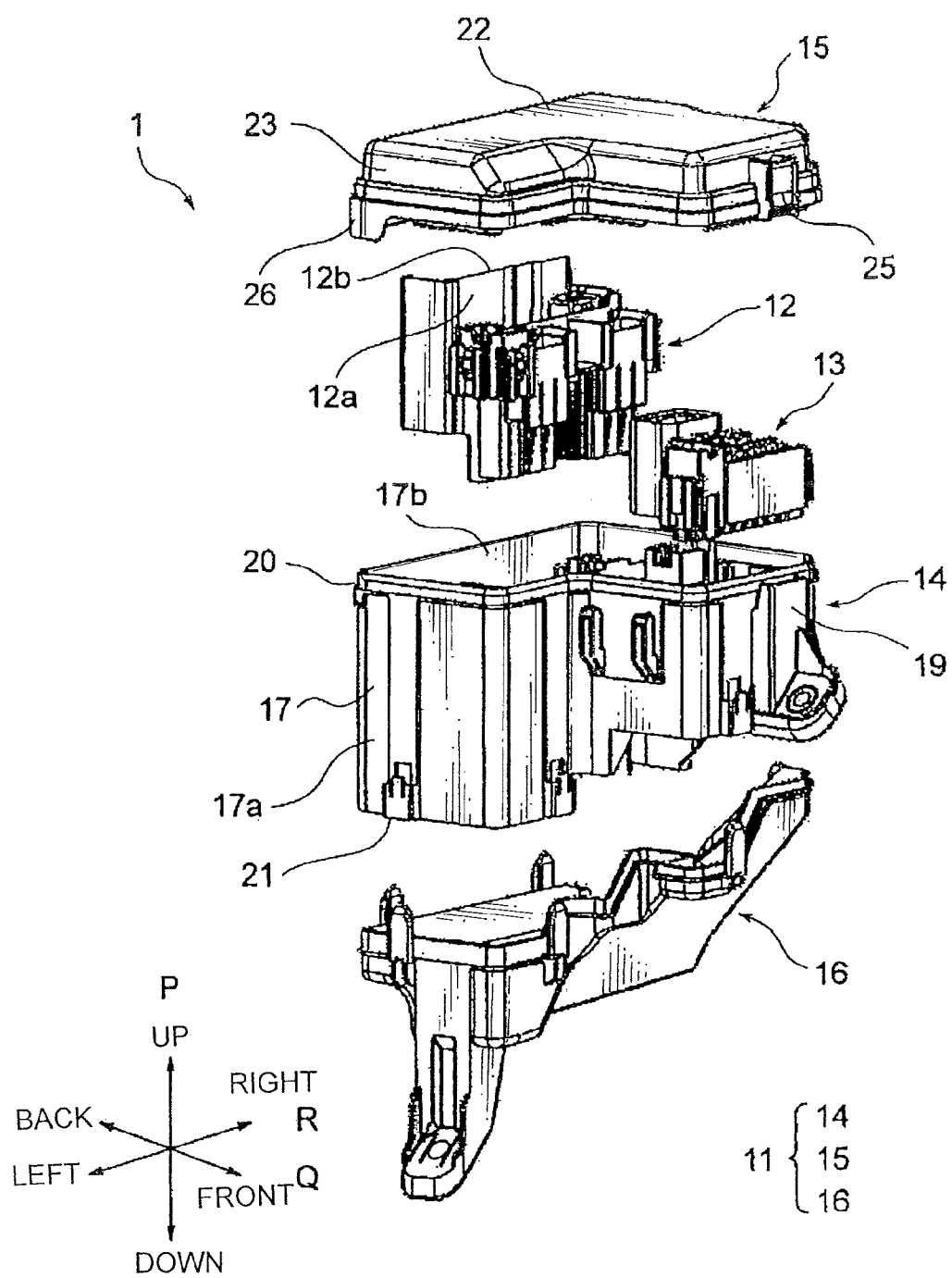
FIG. 2 is an exploded perspective view of the electric junction box.

Hereafter, one example according to an embodiment of the present invention will be explained with reference to the drawings. FIG. 1 is an exemplary diagram showing an example of installation of an electric junction box including a waterproof box of the present invention. FIG. 2 is an exploded perspective view of the electric junction box. FIGS. 3-11 are various views according to the waterproof box of the present invention.

The reference numeral 1 in FIG. 1 shows an electric junction box (self-contained device of vehicular electric components such as R/B: relay box, JIB: junction box, ECU, and the like). The electric junction box 1 is a relay box, but not limited thereto, and mounted on an engine room 3 of a vehicle 2. In the engine room 3, a battery 5 is installed next to an engine 4. The electric junction box 1 is installed next to the battery 5. Since the electric junction box 1 is installed in the engine room 3, it is required to keep fluid like water away from electric components (components do not like water) of the inside of the electric junction box 1 when the vehicle runs in the rain or the engine room 3 is washed with high-pressure.

The electric junction box 1 described below has a waterproof box of the present invention. Even if the injection water pressure in high-pressure is high water pressure such as 8 MPa-12 MPa, ingress of the water into internal electric parts are prevented.

In FIG. 2, the electric junction box 1 has a waterproof box 11 made of synthetic resin, and functional parts 12 and 13 which are received in the waterproof box 11. In the waterproof box 11, for example, a wiring harness (not shown) including an aluminum electric wire is guided. The functional parts 12 and 13 include parts such as a relay (parts such as a relay are not shown in drawings. FIG. 2 mainly shows diagram of cavity). In the cavity of the functional part 12, an inner wall 12a described below is arranged.

The waterproof box 11 has a box main body 14 receiving the functional parts 12 and 13, an upper cover 15 (corresponding to a cover in claims) covering an upper opening of the box main body 14, and a lower cover 16 fitting in the lower section of the box main body 14.

The box main body 14 and the upper cover 15 in the present invention have several features, respectively. As one of the features, although the packing is not used, the waterproof box has waterproof structure which can maintain high waterproof performance. As the other of the features, the upper cover 15 is rotatably moved against the box main body 14, and can be attached and removed with one hand action (one action). Hereafter, the box main body 14 and the upper cover 15 will be explained while those features are included.

The box main body 14 has a peripheral wall 17. The peripheral wall 17 is formed into a frame shape. As shown in FIG. 2, for example the peripheral wall 17 is formed into a shape continuing a plurality of walls. Incidentally, an arrow P defines up and down direction, an arrow Q defines front and back direction, and an arrow R defines right and left direction (Here, the front and back direction and the right and left direction are defined without matching front and back direction of the engine room 3 and right and left direction thereof). In outer surface of the back side wall in the peripheral wall 17, a rotation supporting point 18 is arranged so as to rotate and remove the upper cover 15 (see FIG. 3). Further, in outer surface of the front side wall of the peripheral wall 17, a main body lock 19 is arranged so as to lock the upper cover 15.

The upper cover 15 is rotatebly moved around the rotation supporting point 18 of the box main body 14, and is locked on the main body lock 19. When the locked state is canceled, at the same time, and the upper cover 15 is rotated so that the upper cover 15 is lifted, the upper cover 15 can be easily removed from the box main body 14.

In order to waterproof, a main body side waterproof structure 20 is arranged around the top end of the peripheral wall 17. In the lower portion of the peripheral wall 17, a joint 21 is arranged so as to fit the lower cover 16. Incidentally, the joint 21 is formed with well-known construction. So explanation of the joint 21 is omitted in the embodiment.

The upper cover 15 is a cover member made to conform to the shape of the box main body 14, and has a ceiling wall 22 and a cover peripheral wall 23. The ceiling wall 22 is positioned in the top of the waterproof box 11. The cover peripheral wall 23 extends from the peripheral wall of the ceiling wall 22 downward. In the back side wall of the cover peripheral wall 23, a rotation supporting point 24 (see FIG. 3) is arranged with the rotation supporting point 18 (see FIG. 3) of the box main body 14. The rotation supporting point 24 is the center of rotation of the upper cover 15. Also, in the front side wall of the cover peripheral wall 23, a lock cover 25 is arranged so as to be caught and locked in the main body lock 19. In the bottom end of the cover peripheral wall 23, a cover side waterproof structure 26 is arranged so as to waterproof.

A common known lower cover is used as the lower cover 16, and a detailed explanation of the lower cover 16 is omitted.

Figure 3:
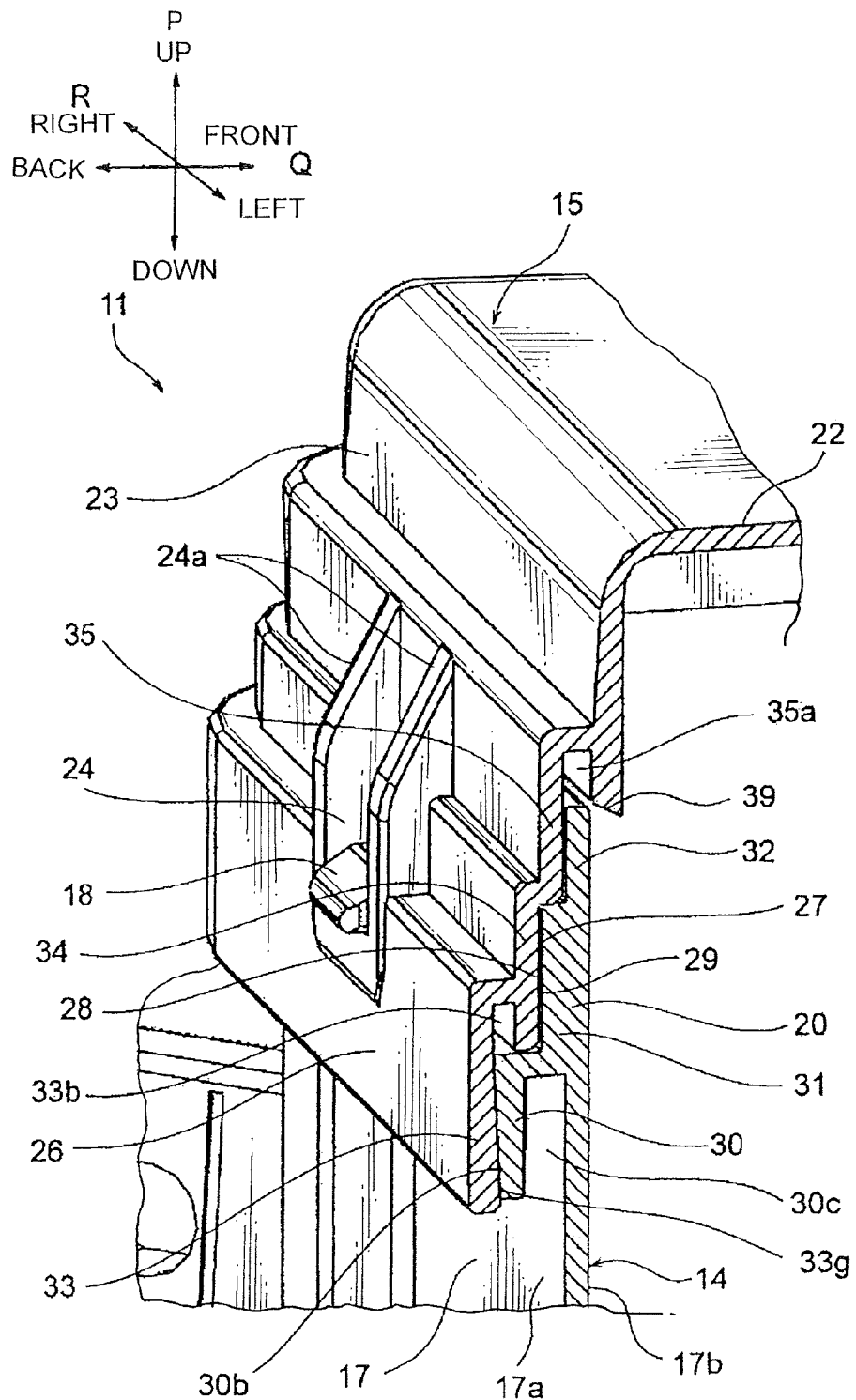
FIG. 3 is a perspective view (including a part cross-section) showing a main body side waterproof structure and a cover side waterproof structure.
Figure 4:
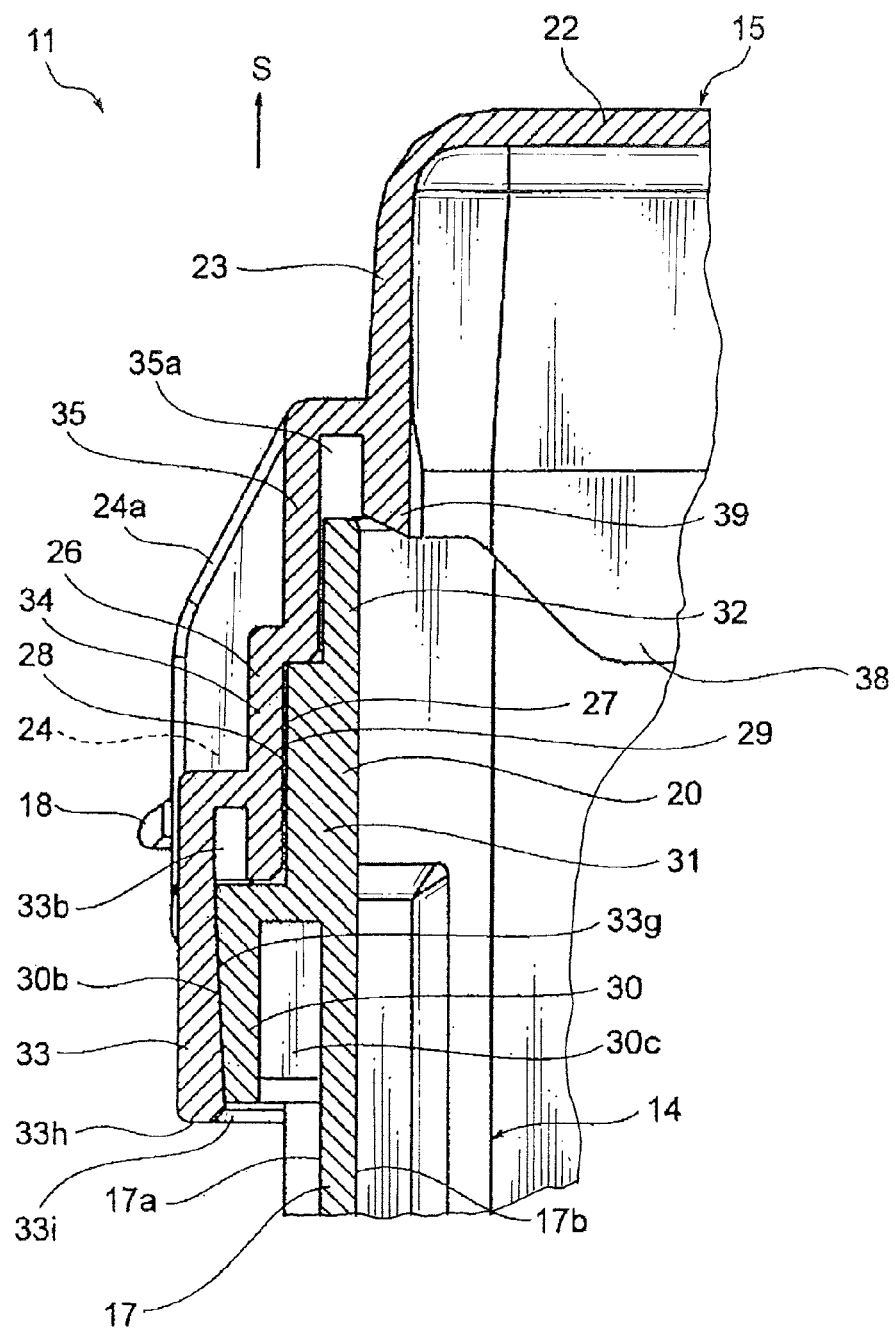
FIG. 4 is a cross-sectional view showing the main body side waterproof structure and the cover side waterproof structure.

The main body side waterproof structure 20 and the cover side waterproof structure 26 will be explained with reference to FIGS. 3-8. In FIGS. 3 and 4, as typical examples of all circumferences of the peripheral wall, waterproof structure of the wall including the rotation supporting points 18, 24 is respectively shown.

In FIGS. 3 and 4, the upper cover 15 is rotated against the box main body 14, and is locked in the box main body 14. When the upper cover 15 is locked in the box main body 14, the main body side waterproof structure 20 and the cover side waterproof structure 26 are overlapped as shown in FIGS. 3 and 4.

While, it is required to consider rotation trajectory in structure in order to rotate the upper cover 15. However, it is impossible to be overlapped around all circumferences without a gap. Therefore, a minute path 27 generated by a gap between opposed surfaces (matching surfaces described below) is formed between the main body side waterproof structure 20 and the cover side waterproof structure 26 (FIG. 5B indicates a water infiltration direction and shows exemplary minute path 27). Also, preventing the ingress of water in the minute path 27 and greatly reducing the entering water power are purpose of waterproof structure of the waterproof box 11.

A main body side matching surface 28 is formed in the main body side waterproof structure 20. A cover side matching surface 29 is formed in the cover side waterproof structure 26. The main body side matching surface 28 and the cover side matching surface 29 are opposed by overlapping the upper cover 15 and the box main body 14. Each surface constructing the main body matching surface 28 and the cover side matching surface 29 will be explained below.

In FIGS. 3 to 8, the main body side waterproof structure 20, as discussed previously, is arranged in the top end of the peripheral wall 17, and is a part preventing water entry. Further, the main body side waterproof structure 20 has a first waterproof portion 30 arranged in the inlet of the minute path 27, a second waterproof portion 31 arranged in the middle of the minute path 27 and a third waterproof portion 32 arranged in the outlet of the minute path 27 (inlet of the minute path 27 is a portion in which water is first entered from outside). The waterproof box of the present invention will be explained from the third waterproof portion 32 sequentially.

The third waterproof portion 32 is positioned at the top edge of the peripheral wall 17, and formed in the same thickness as the peripheral wall 17 (an outer surface 17*a* and an inner surface 17*b*, which they determine the thickness of the peripheral wall 17, are formed along the up and down direction). The third waterproof portion 32 has an upper surface 32*a* fitting in the top end of the peripheral wall 17. The upper surface 32*a* is formed as a surface including a part of the main body side matching surface 28. Further, the outer surface 32*b* perpendicular to the upper surface 32*a* and continuing thereto is formed as a surface including a part of the main body side matching surface 28. The outer surface 32*b* is formed parallel to an inner surface 17*b* of the peripheral wall 17. The upper surface 32*a* has a chamfered portion 32*c*. The chamfered portion 32*c* is arranged in a position continuing to the inner surface 17*b*.

The second waterproof portion 31 is arranged under the third waterproof portion 32 and formed. The second waterproof portion 31 is formed with a about double thickness of the third waterproof portion 32 (about double thickness is one example). The second waterproof portion 31 is formed so that the portion thicker than the third waterproof portion 32 is projected outward. The upper surface 31*a* of the second waterproof portion 31 is perpendicular to the outer surface 32*b* of the third waterproof portion 32 and continued thereto. Further, the upper surface 31*a* is formed parallel to the upper surface 32*a* of the third waterproof portion 32. The upper surface 31*a* is formed as a surface including a part of the main body side matching surface 28. The outer surface 31*b* perpendicular to the upper surface 31*a* and continuing to the upper surface 31*a* is formed longer than the outer surface 32*b* of the third waterproof portion 32. The outer surface 31*b* is formed parallel to the inner surface 17*b* of the peripheral wall 17. The outer surface 31*b* is formed as a surface including a part of the main body side matching surface 28. In a prescribed position of the outer surface 31b, the rotation supporting point 18 which is formed into a protrusion shape and projects outward is arranged.

The first waterproof portion 30 is arranged under the second waterproof portion 31 and formed. The first waterproof portion 30 projects further outward more than the second waterproof portion 31. The upper surface 30a of the first waterproof portion 30 is perpendicular to the outer surface 31b of the second waterproof portion 31 and continued thereto. Further, the upper surface 30a is formed parallel to the upper surface 31a of the second waterproof portion 31, and formed longer than the upper surface 31a of the second waterproof portion 31. The upper surface 30a is formed as a surface including a part of the main body side matching surface 28. The outer surface 30b continued to the upper surface 30a is not parallel to the inner surface 17b of the peripheral wall 17. The outer surface 30b is sloped. More specifically, the outer surface 30b is formed into a taper shape in which distance from the inner surface 17b becomes gradually small toward bottom. A groove 30c is formed between the taper-shaped outer surface 30b and the outer surface 17a of the peripheral wall 17.

The groove 30c is formed so that the bottom side of the groove 30c is opened and the upper side thereof is a dead end. Furthermore, the groove 30c has a space formed in a desired size. In the inside of the groove 30c, an inner surface 30d fitting in the outer surface 17a of the peripheral wall 17, an outside surface 30e parallel to the inner surface 30d, and an innermost surface 30f parallel to the upper surface 30a are included. The groove 30c is formed so that the space is larger than the other grooves 35a, 33b (the groove 30c is formed so that washing water enters into the space).

The main body side matching surface 28 including surfaces from the upper surface 32a of the third waterproof portion 32 to the taper-shaped outer surface 30b of the first waterproof portion 30 is formed in a stepped shape, namely, labyrinthine shape. That is, the main body side matching surface 28 is formed in a shape in which water is hard to enter.

On the other hand, the cover side waterproof structure 26, as discussed previously, is arranged in the bottom end of the cover peripheral wall 23, and is a part preventing water entry. Further, the cover side waterproof structure 26 has a first waterproof portion 33 arranged in the inlet of the minute path 27, a second waterproof portion 34 arranged in the middle of the minute path 27, and a third waterproof portion 35 arranged in the outlet of the minute path 27. The wall of the cover side waterproof structure 26 is formed in a skirt shape opening outward. The first waterproof portion 33 is arranged and formed corresponding to the first waterproof portion 30 of the main body side waterproof structure 20. The second waterproof portion 34 is arranged and formed corresponding to the second waterproof portion 31 of the main body side waterproof structure 20. Further, the third waterproof portion 35 is arranged and formed corresponding to the third waterproof portion 32 of the main body side waterproof structure 20. It will be explained from the third waterproof portion 35 sequentially.

The third waterproof portion 35 has a groove 35a opening in a surface (the surface can form the cover side matching surface 29) opposed to the upper surface 32a of the third waterproof portion 32 of the main body side waterproof structure 20. The groove 35a is formed so that the bottom side of the groove 35a is opened and the upper side thereof is a dead end. Furthermore, the groove 35a has a space formed in a desired size. In the inside of the groove 35a, an inner surface 35b, an outer surface 35c parallel to the inner surface 35b, and an innermost surface 35d connecting the inner surface 35b and the outer surface 35c are included. The inner surface 35b is located immediately above the inner surface 17b of the peripheral wall 17 of the box main body 14. The groove 35a is formed so that the inner surface 35b is arranged in the bottom end of the cover peripheral wall 23.

Regarding to arrangement of the groove 35a and an outlet position, a position of an intersection of the opening of the groove 35a with the inner surface 35b is set as an outlet standard 36. Further, a position of an intersection of the inner surface 17b of the peripheral wall 17 with the upper surface 32a of the third waterproof portion 32 is set as an outlet standard 37. As a result, the outlet standards 36 and 37 are arranged on the same plane. That is, the outlet standards 36 and 37 are arranged so that water is hard to discharge from the outlet and the outlet of the minute path 27 is minimized as much as possible (when the outlet standard 36 is positioned inside the outlet standard 37, the width of the outlet is increased. As a result, water is easy to discharge from the outlet of the minute path 27).

Figure 9:
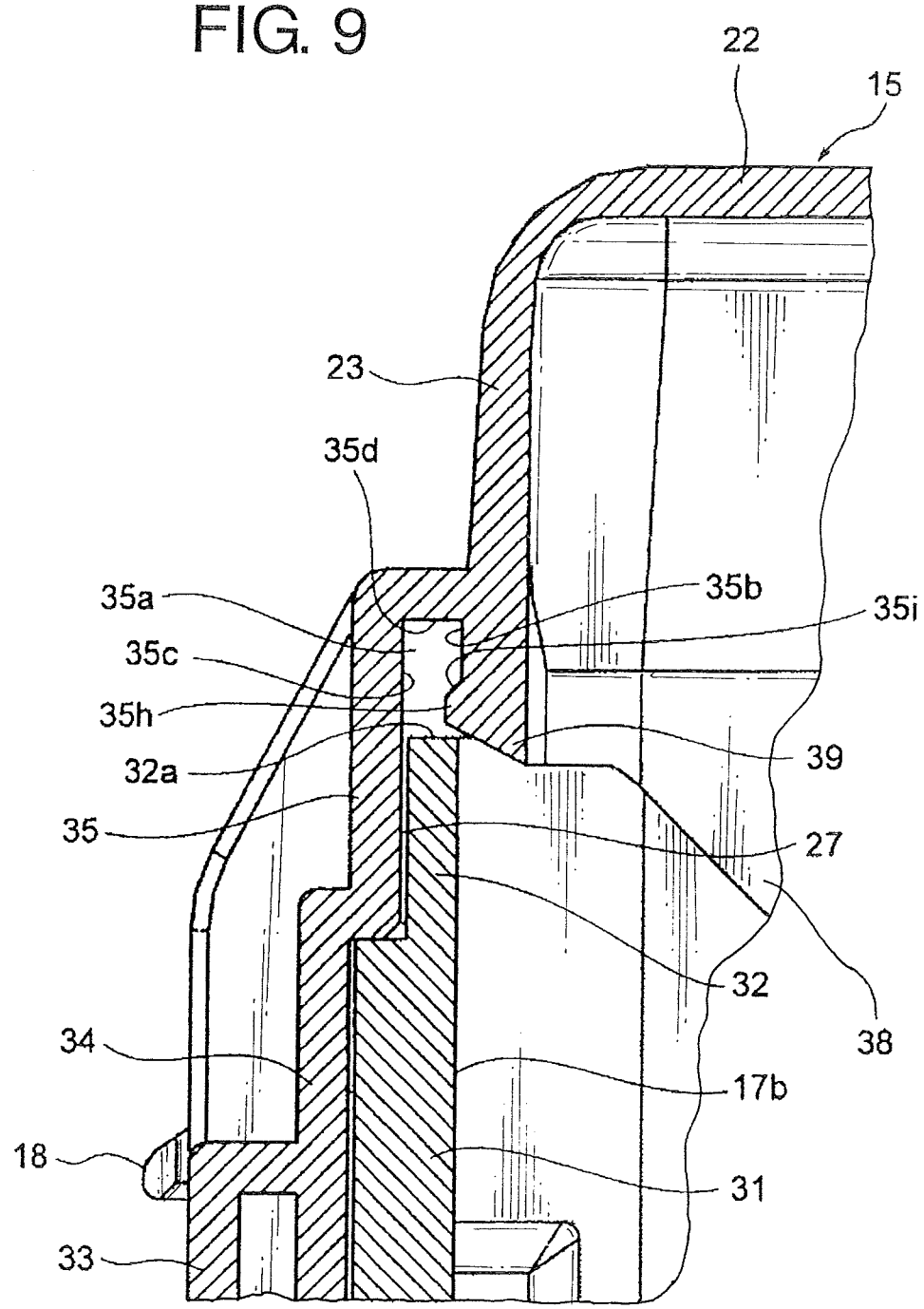
FIG. 9 is a cross-sectional view showing first deformation example of a groove.
Figure 10:
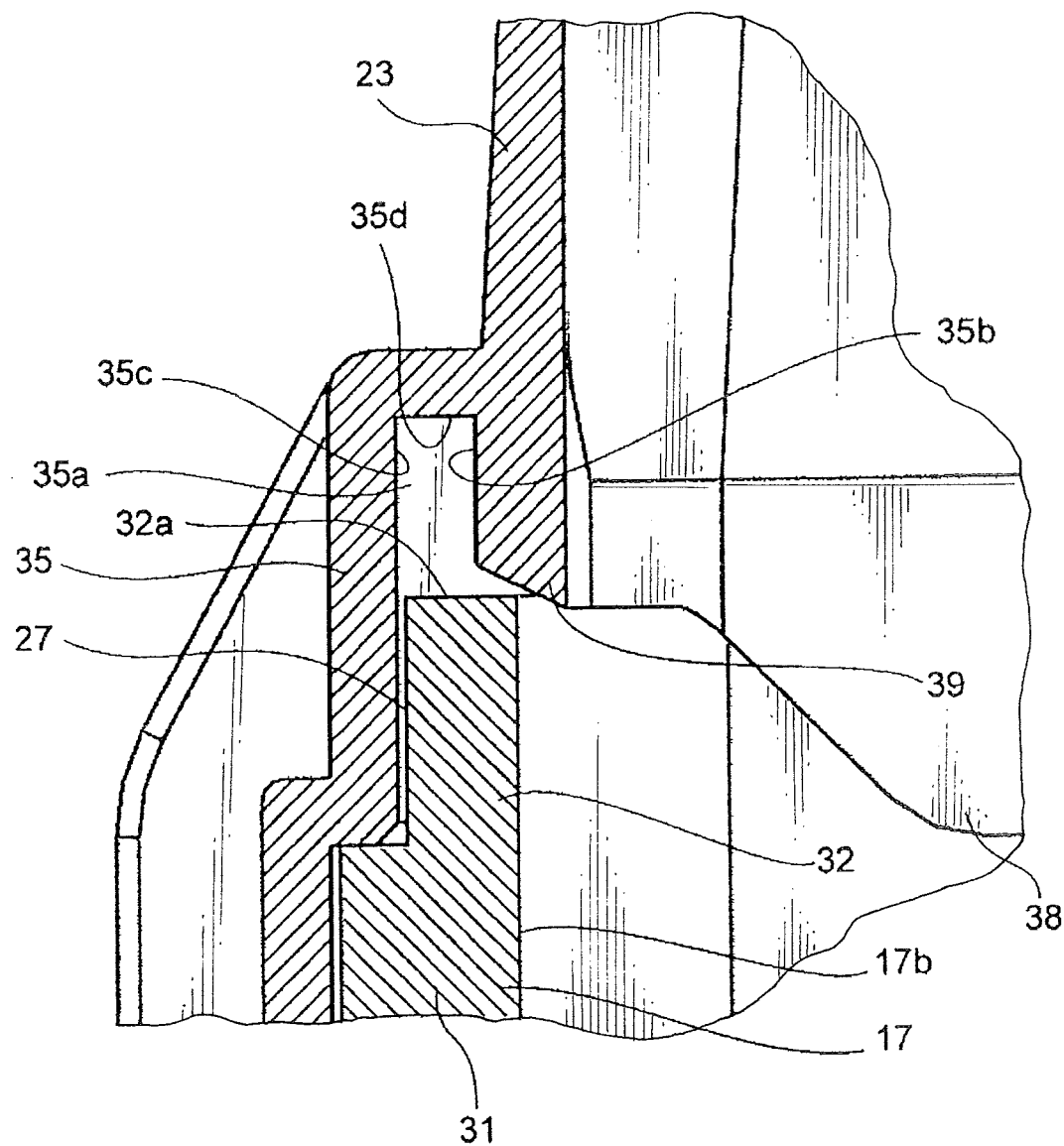
FIG. 10 is a cross-sectional view showing second deformation example of the groove.
Figure 11:
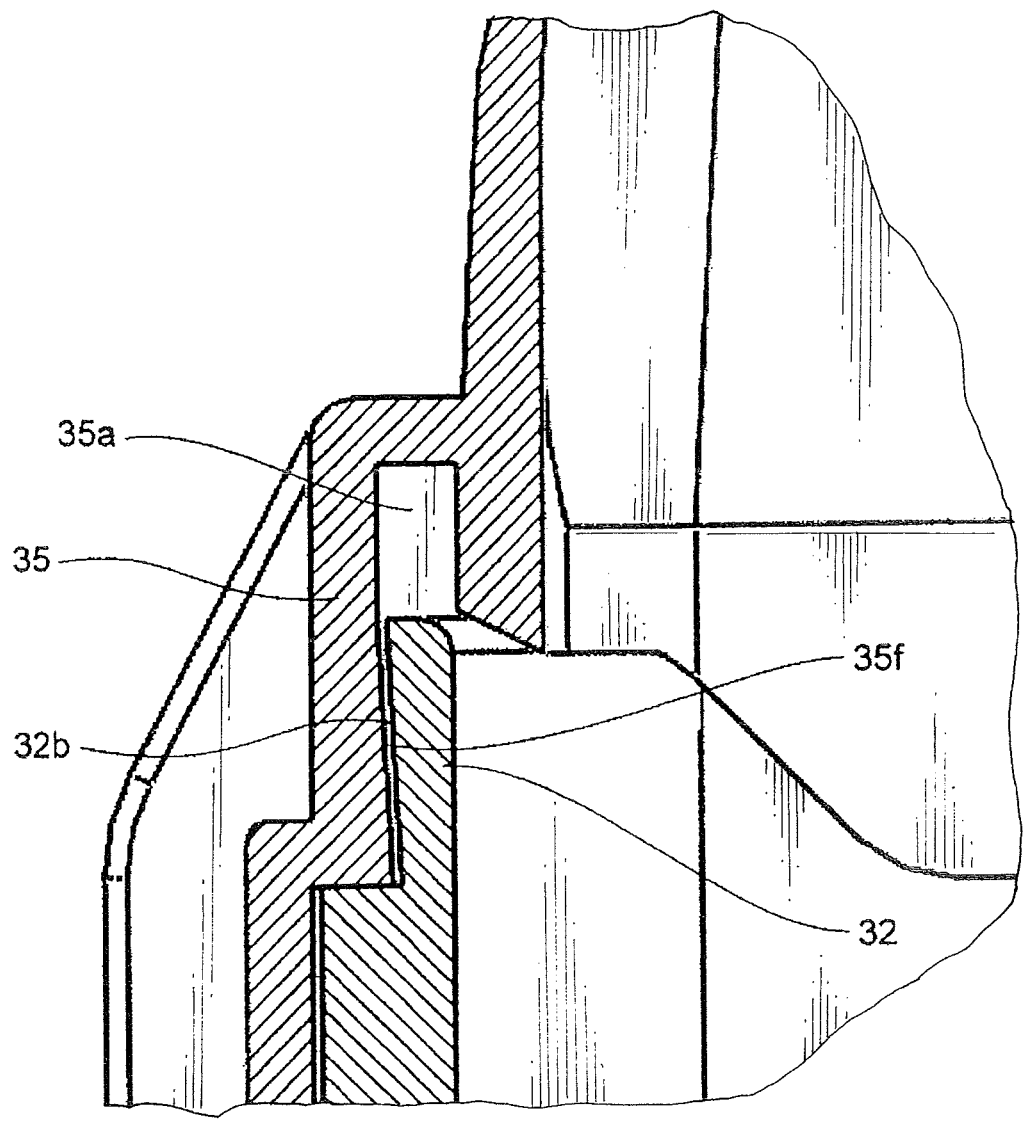
FIG. 11 is a cross-sectional view showing another example of the third waterproof portion providing a taper shaped surface.

As another example of the groove 35a, there are shapes shown in FIGS. 9 and 10.

As shown in FIG. 9, a projection 35h is formed in the groove 35a, and projected from the inner surface 35b toward the outer surface 35c. The projection 35h is arranged according to the outlet position of the minute path 27, and has a tapered surface 35i in the upper side. The power of water entered into the groove 35a is reduced by the presence of space having the prescribed size in the groove 35a and by hitting the innermost surface 35d. Further, when water falls down, the water is guided in a direction away from the outlet of the minute path 27 by the tapered surface 35i of the projection 35h.

Figure 5:
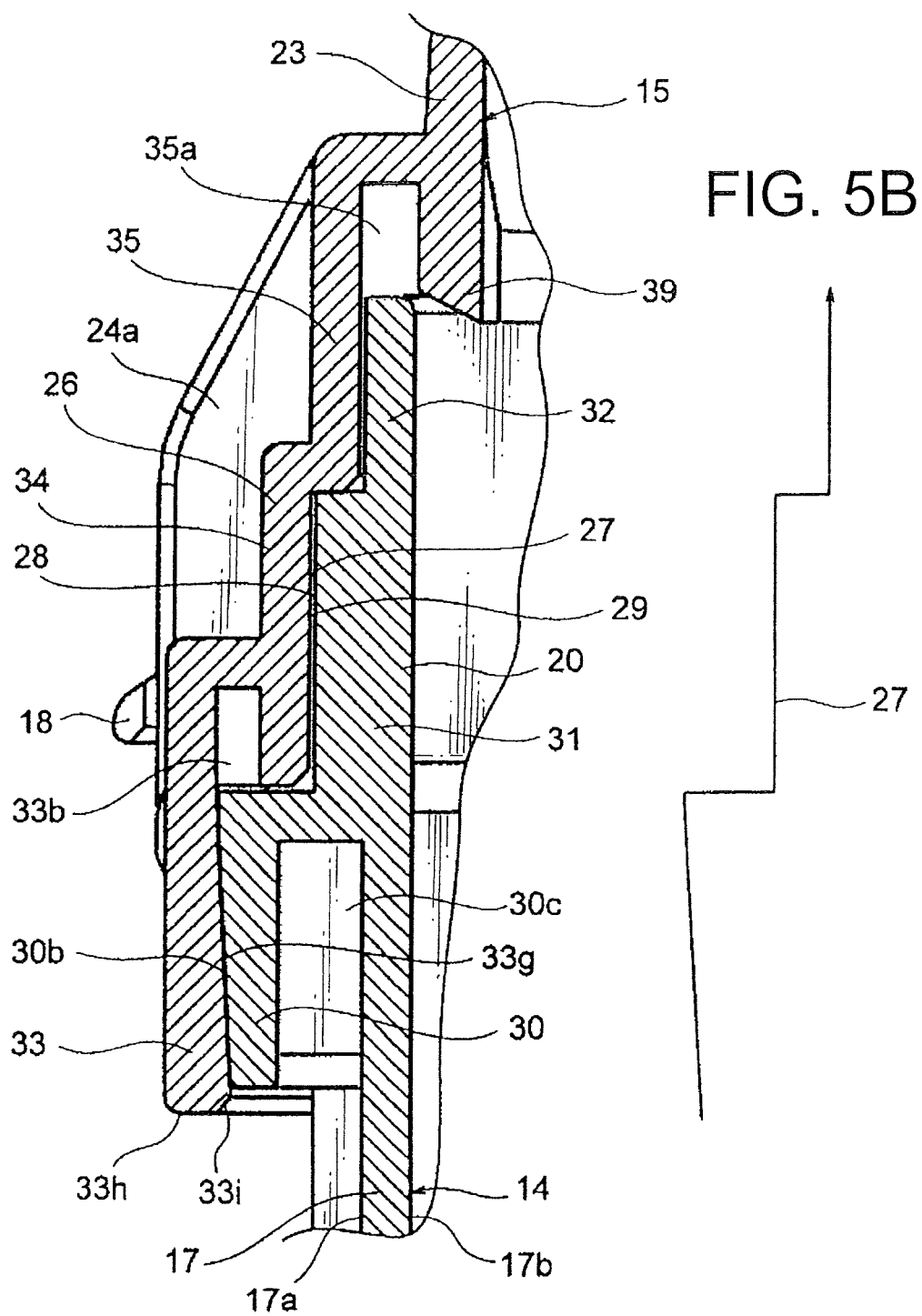
FIG. 5A is a cross-sectional view of the main body side waterproof structure and the cover side waterproof structure according to a minute path.
FIG. 5B is an exemplary diagram of the minute path.
Figure 6:
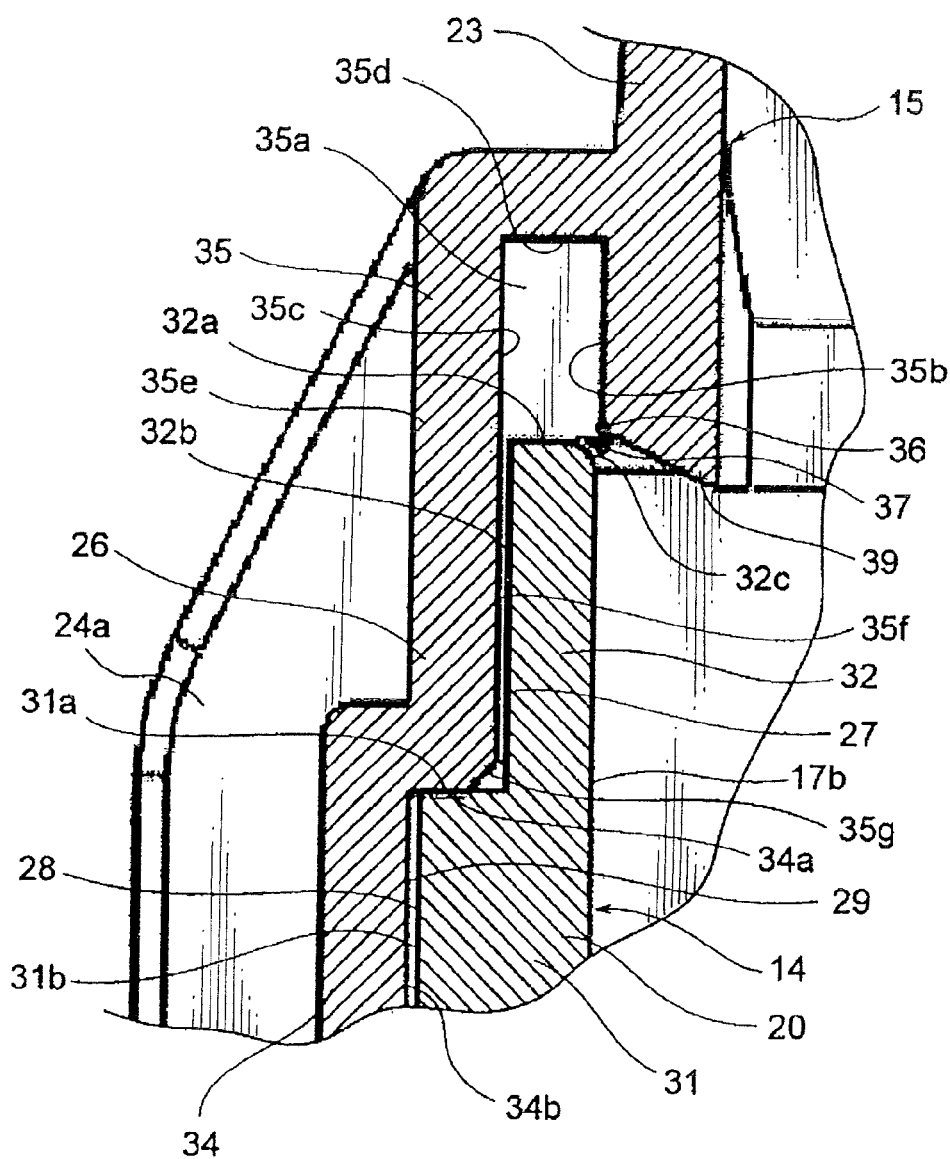
FIG. 6 is an enlarged sectional view of third waterproof portion.
Figure 7:
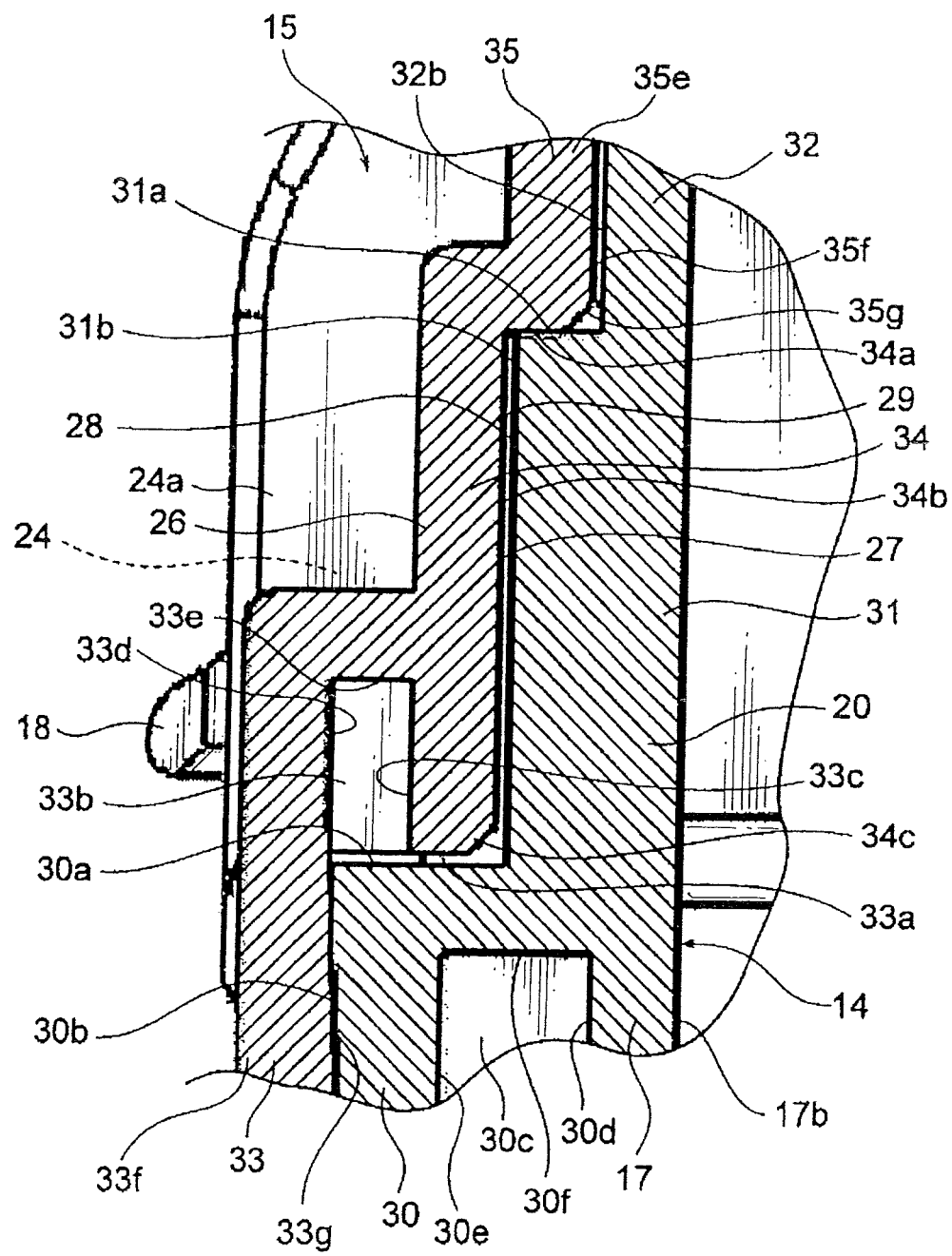
FIG. 7 is an enlarged sectional view of second waterproof portion.
Figure 8:
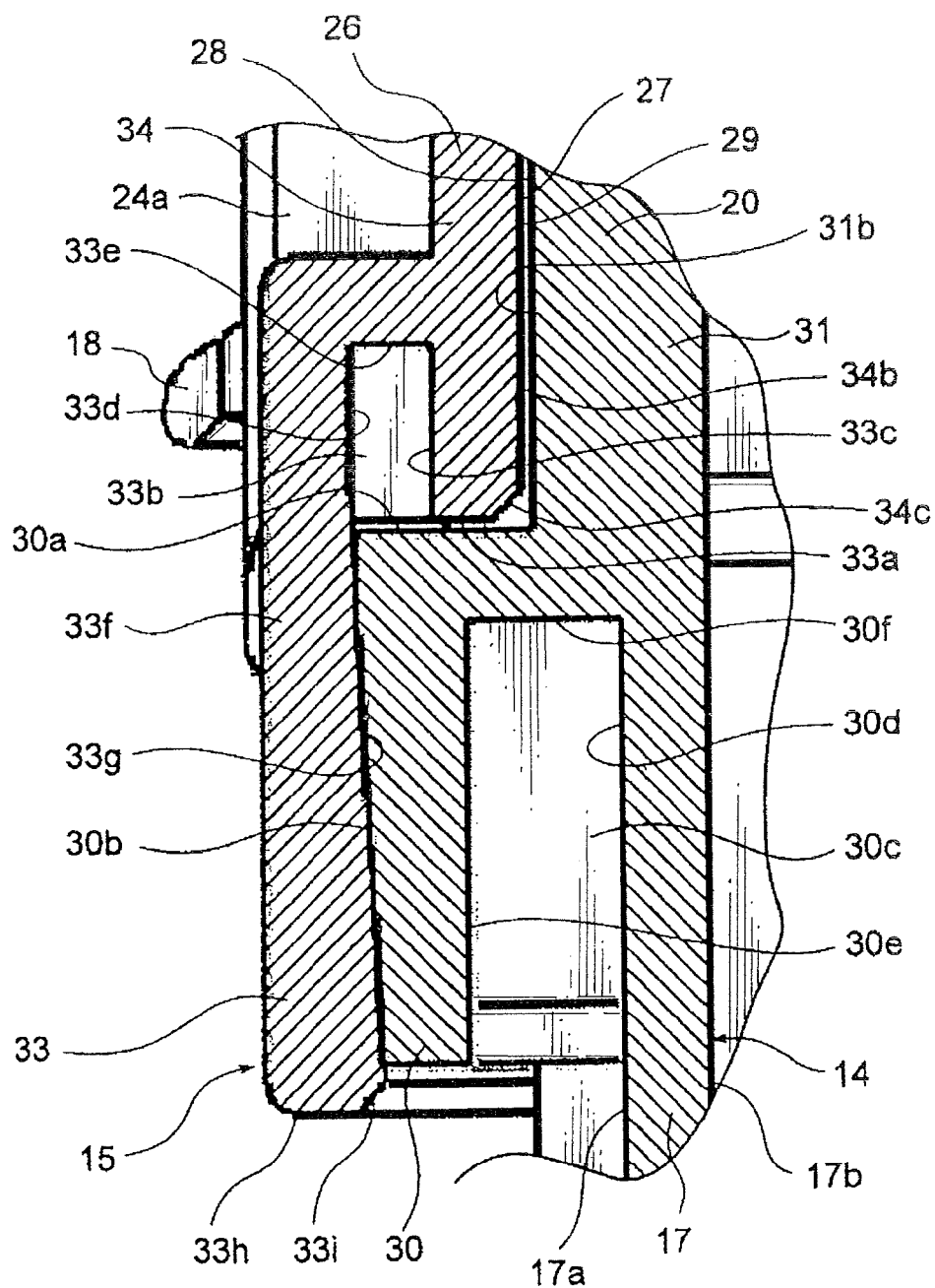
FIG. 8 is an enlarged sectional view of first waterproof portion.

As shown in FIG. 10, the groove 35a is formed close to the outer surface 35c compared to the inner surface 35b of FIGS. 5 and 6. Furthermore, in the groove 35a, since the inner surface 35b is positioned outward, a taper portion 39 described below is positioned directly above the inner surface 17b of the peripheral wall 17 (outlet standard 36 is positioned outside of the outlet standard 37). The power of water entered into the groove 35a is reduced by the presence of space having the prescribed size in the groove 35a and by hitting the innermost surface 35d. And then, the water falls into a position away from the outlet of the minute path 27.

Reverting to FIGS. 3 to 8, the third waterproof portion 35 has a wall-shaped portion 35e which continues to the groove 35a and extends thereto. The wall-shaped portion 35e has an inner surface 35f opposed to the outer surface 32b of the third waterproof portion 32 of the main body side waterproof structure 20. The inner surface 35f is formed as a surface including a part of the cover side matching surface 29. The inner surface 35f has a small chamfered portion 35g which is arranged in a position continuing to the second waterproof structure 34 (The chamfered portion 35g is formed as the surface including a part of the cover side matching surface 29 just like the inner surface 35f).

The second waterproof portion 34 is arranged under the third waterproof portion 35. The second waterproof portion 34 has a lower surface 34a opposed to the upper surface 31a of the second waterproof structure 31 of the main body side waterproof structure 20 and an inner surface 34b opposed to the outer surface 31b, and is formed into a wall shape. One end of the lower surface 34a continues to the chamfered portion 35g of the waterproof structure 35, and the other end thereof continues to the inner surface 34b. The inner surface 34b is formed so that the inner surface 34b is perpendicular to the lower surface 34a and extends straight downward. Such inner surface 34b has a small chamfered portion 34c which is arranged in a position continuing to the first waterproof structure 33. The lower surface 34a, the inner surface 34b and the chamfered portion 34c are formed as a surface including a part of the cover side matching surface 29.

The first waterproof structure 33 is arranged under the second waterproof structure 34. The first waterproof structure 33 has a lower surface 33a opposed to the upper surface 30a of the waterproof structure 30 of the main body side waterproof structure. In the lower surface 33a, the groove 33b which opens in this position is arranged. The groove 33b is formed so that the lower side of the groove 33b opens and the upper side thereof stops. The groove 33b has space formed in a desired size. In the inside of the groove 33b, the inner surface 33c, the outer surface 33b parallel to the inner surface 33c and the innermost surface 33e connecting the inner surface 33c with the outer surface 33b are provided. The inner surface 33c is formed in a direction perpendicular to the upper surface 30a of the waterproof structure 30.

The first waterproof portion 33 has a wall-shaped portion 33f which continues to the groove 33b and extends thereto. The wall-shaped portion 33f has an inner surface 33g which is a tapered surface. The inner surface 33g is opposed to the outer surface 30b which is a tapered surface of the first waterproof structure 30 of the main body side waterproof structure 20. Further, when the upper cover 15 is moved to upside, the inner surface 33g is abutted on the outer surface 30b and fit therein. The inner surface 33g and each upper surface of the inner surface 33g are formed as a surface including a part of the cover side matching surface 29.

The first waterproof portion 33 has a lower surface 33h which is the lowest end of the upper cover 15 and a chamfered portion 33i which is arranged in a position continuing to the lower surface 33h and the inner surface 33g.

The rotation supporting point 24 arranged in the cover side waterproof structure 26 has a through hole (not shown) which is able to insert the projection-shaped rotation supporting point 18 of the main body side waterproof structure and a pair of protective walls 24a which is formed in both sides of the through hole. The protective walls 24a are formed into a rib shape, and extend in up and down direction.

Reverting to FIG. 2, the inner wall 12a is arranged in a cavity of the functional parts 12. The inner wall 12a is arranged at a predetermined interval from an inner surface 17b of the peripheral wall 17 of the box main body 14. The inner wall 12a is projected and formed so that the tip 12b of the inner wall 12a is located in the end of the cover peripheral wall 23. The tip 12b of the inner wall 12a is positioned above the outlet position of the minute path 27. The inner wall 12a is formed as a part so as to keep fluid such as water away from electric components (components do not like water) separately from the main body side waterproof structure 20 and the cover side waterproof structure 26.

Waterproof is enough with the main body side waterproof structure 20 and the cover side waterproof structure 26 so as to prevent the ingress of water against the electric components (parts do not like water). However, the formation of the inner wall 12a is effective so as to increase reliability.

As shown in FIG. 4, the upper cover 15 has an inner wall 38 opposed to the inner surface 17b of the peripheral wall 17 of the box main body 14 and extending thereto. The inner wall 38 extends from the lower end of the cover peripheral wall 23 and is arranged therein. The inner wall 38 is provided without a wall having the rotation supporting portion 24 which is the center of rotation of the upper cover 15. Because the upper cover 15 is rotatably moved, the inner wall 38 is arranged without the above wall in view of rotation trajectory. In the wall having the rotation supporting portion 24, a taper portion 39 is arranged so that the tip of the taper portion 39 is positioned under the outlet portion of the minute path 27. The taper portion 39 slightly functions as an inner wall.

In the above configuration and construction, the rotation supporting point 24 of the upper cover 15 is inserted into the rotation supporting point 18 of the box main body 14 by holding the upper cover 15 with one hand. And then, the upper cover 15 is rotated around the rotation supporting points 18 and 24, and the cover lock 25 of the upper cover 15 is locked in the main body lock 19 of the box main body 14 (locked state). An upper opening of the box main body 14 is covered with the upper cover 15. At this time, when the main body side waterproof structure 20 and the cover side waterproof structure 26 are overlapped, the formation of the waterproof structure as shown in FIGS. 4 and 5 is completed. Also, when the main body side waterproof structure 20 and the cover side waterproof structure 26 are overlapped, the main body side matching surface 28 opposes to the cover side matching surface 29.

When high-pressure washing is performed, the washing water injected toward the waterproof box 11 hits in the outer surface 17a of the peripheral wall 17 of the box main body 14. Thereafter the washing water rising along the peripheral wall 17. The washing water rising along the peripheral wall 17 enters in the groove 30c of the main body side waterproof structure 20. As a result, force of the washing water is reduced. The groove 30c functions as a buffer, and the washing water, in which the force thereof is reduced, falls down.

The inlet of the minute path 27 is arranged away from the outer surface 17a of the peripheral wall 17 of the box main body 14, and the majority force of the washing water is reduced. As a result, the washing water hitting in the inlet of the minute path 27 is small in amount, and the ingress of water is difficult (when the washing water does not hit directly in the inlet of the minute path 27, the ingress of water is difficult).

The washing water hits in the lower surface 33h (the lower surface 33h being the lowest end of the upper cover 15) of the first waterproof portion 33 of the upper cover 15, and the upper cover 15 moves in the arrow S. Specifically, when spray (uplift) is generated in the upper cover 15, the taper-shaped outer surface 30b of the first waterproof portion 30 abuts on the taper-shaped inner surface 33g of the first waterproof portion 33, and engages therewith. As a result, the inlet of the minute path 27 is closed. Thereby, the ingress (pass) of water is prevented.

Hereafter, explanatory matter will be explained. The ingress of water is prevented by fitting the outer surface 30b in the inner surface 33g. If water slightly enters, the waterproof box becomes as follows.

More specifically, even if the ingress of water is generated before the taper-shaped outer surface 30b are fit in the inner surface 33g, water enters in the groove 33b and the force of the water is reduced, because a direction of water movement is an extending direction of the outer surface 30b and the inner surface 33g.

Even if water leaks primarily from the groove 33b, the ingress (pass) of water is prevented because the minute path 27 has a plurality of steps (corners) and is formed in a maze shape.

Furthermore, even through water is entered between the outer surface 32b of the third waterproof portion 32 and the inner surface 35f of the third waterproof portion 35, water is entered in the groove 35a and force of the water is reduced because the direction of water movement is an extending direction of the outer surface 32b and the inner surface 35f. The groove 35a functions as a buffer, and the water in which the force of the water is reduced falls down.

As described above, since the outlet of the minute path 27 is minimized as much as possible, the water, in which the force of the water is reduced by entering in the groove 35a, is difficult to discharge from the outlet of the minute path 27. Even through water exits from the outlet of the minute path 27, the water falls down along the inner surface 17b of the peripheral wall 17 and is discharged from an outlet (not shown) of the lower cover 16.

Also, the outer surface 31b of the second waterproof portion 31 and the inner surface 34b of the second waterproof portion 34 may have the same function as the outer surface 30b and the inner surface 33g (namely, the outer surface 31b and the inner surface 34b may be formed into a taper shape. Thereby, water leakage can be more effectively prevented). Further, the outer surface 32b of the third waterproof structure 32 and the inner surface 35f of the third waterproof structure 35 may have the same function as the outer surface 30b and the inner surface 33g (see FIG. 11).

Figure 12:
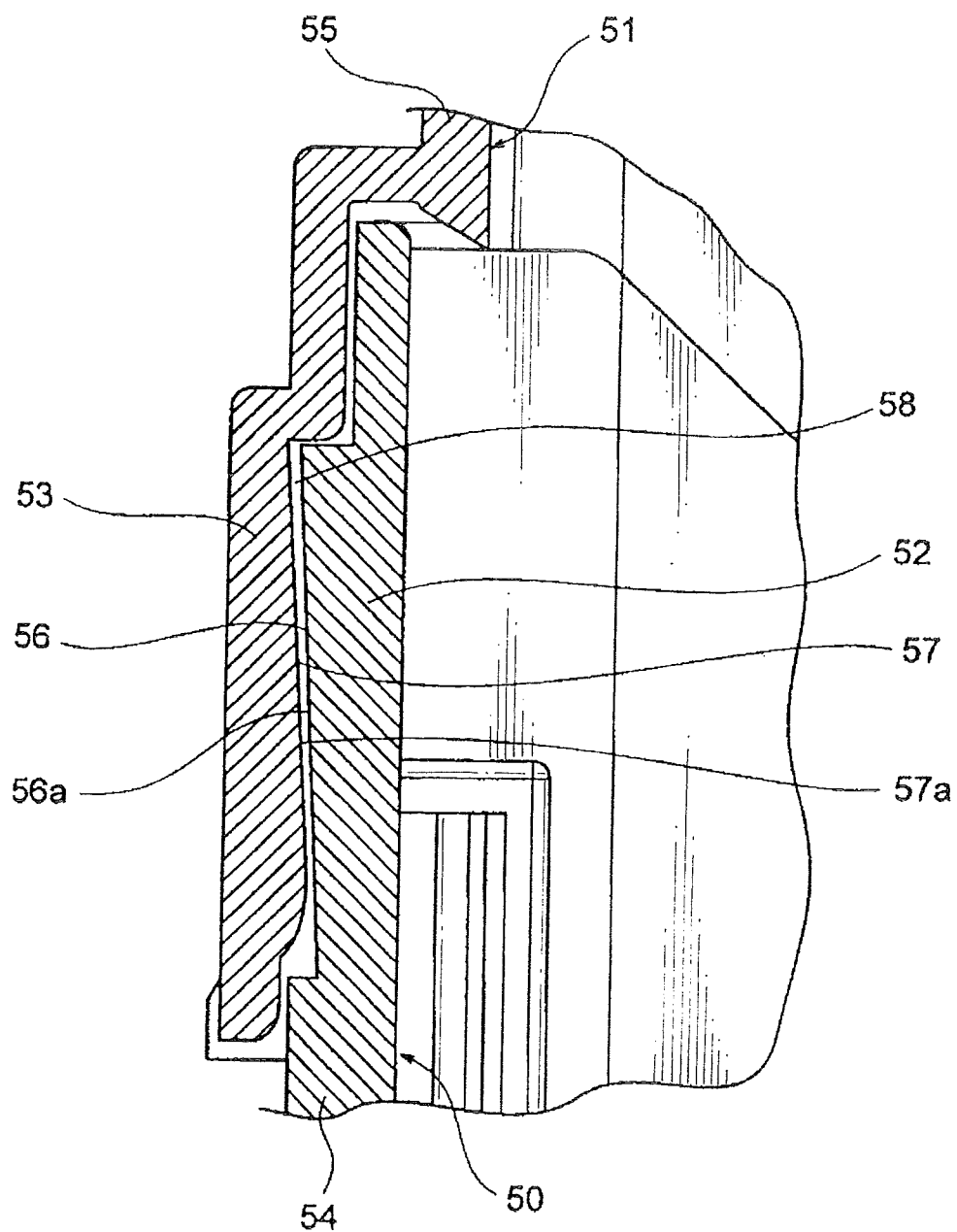
FIG. 12 is a cross-sectional view showing another embodiment of the main body side waterproof structure and the cover side waterproof structure.

Next, another embodiment will be explained with reference to FIG. 12. FIG. 12 is a cross-sectional view showing another embodiment of the main body side waterproof structure and the cover side waterproof structure. Another embodiment is one example of another waterproof structure waterproofing by fitting a tapered surface (as it will be understood from the explanation of FIGS. 3 to 8, because the ingress (pass) of water is enough prevented by fitting the outer surface 30b in the inner surface 33g).

As shown in FIG. 12, a main body side waterproof structure 52 and a cover side waterproof structure 53 are overlapped when the upper cover 51 (corresponding to a cover in claims) is rotated against the box main body 50, and locked on the box main body 50.

The main body side waterproof structure 52 is arranged in the tip end of a peripheral wall 54 of the box main body 50, and is a part for waterproofing. The cover side waterproof structure 53 is arranged in the lower end of a cover peripheral wall 55, and is a part for waterproofing. A main body side matching surface 56 is formed in the main body side waterproof structure 52, and a cover side matching surface 57 is formed in the cover side waterproof structure 53. The main body side matching surface 56 is opposed to the cover side matching surface 57 by overlapping the main body side matching surface 56 in the cover side matching surface 57. A minute path 58 is formed between the main body side matching surface 56 and the cover side matching surface 57. A tapered outer surface 56a and a tapered inner surface 57a are formed in the main body side matching surface 56 and the cover side matching surface 57, respectively. (There is the same shape as the outer surface 30b and the inner surface 33g shown in FIGS. 3 to 8).

In the above configuration and construction, when the upper cover 51 is moved in the arrow S and spray (uplift) is generated, the tapered outer surface 56a abuts on the tapered inner surface 57a and is engaged therewith and the inlet of a minute path 58 is closed. Thereby, the ingress (pass) of water is prevented.

In conclusion, as is understood from the above explanation with reference to drawings, the waterproof box of the present invention can improve waterproof performance than ever before. Further, work efficiency can be increased and space can be saved, because the upper covers 15 and 51 can be attached and removed with one hand.

While, it will be understood that various change and modifications can be made without departing the scope of the present invention.

REFERENCE SINGS 1 electric junction box
2 vehicle
3 engine room
4 engine
5 battery
11 waterproof box
12, 13 functional parts
14 box main body
15 upper cover (cover)
16 lower cover
17 peripheral wall
18 rotation supporting point
19 main body lock
20 main body side waterproof structure
21 joint
22 ceiling wall
23 cover peripheral wall
24 rotation supporting point
25 cover lock
26 cover side waterproof structure
27 minute path
28 main body side matching surface
29 cover side matching surface
30, 33 first waterproof portion
31, 34 second waterproof portion
32, 35 third waterproof portion
36, 37 outlet standard
38 inner wall
39 taper portion
50 box main body
51 upper cover (cover)
52 main body side waterproof structure
53 cover side waterproof structure
54 peripheral wall
55 cover peripheral wall
56 main body side matching surface
57 cover side matching surface
58 minute path

The invention claimed is:

1. A waterproof box comprising:
a main body having an interior wall and a peripheral wall and non-waterproof receiving components inside of the peripheral wall;
a cover having a cover peripheral wall, the cover covering an opening formed between edges of the peripheral wall of the main body and edges of the cover peripheral wall;
a main body side waterproof structure arranged around a top end of the peripheral wall of the main body; and
a cover side waterproof structure arranged on a bottom end of the cover peripheral wall,
wherein the main body side waterproof structure is overlapped with the cover side waterproof structure so as to waterproof, causing a main body side matching surface and a cover side matching surface to oppose each other,
wherein the main body side matching surface and the cover side matching surface are formed as at least a tapered surface which are abutted and fit when the cover is moved in a direction removing the main body, and
wherein a groove is formed in between the cover peripheral wall and a third waterproof member in an outlet of a minute path.

2. The waterproof box as claimed in claim 1, wherein rotation supporting points are arranged in the main body side waterproof structure and the cover side waterproof structure respectively so that the cover is rotatably and removably moved against the main body.

3. The waterproof box as claimed in claim 1,
wherein the main body side waterproof structure has a first waterproof portion arranged in an inlet of the minute path, a second waterproof portion arranged in a middle of the minute path, and a third waterproof portion arranged in an outlet of the minute path, and wherein an outer surface of the first waterproof portion is formed into a taper shape in which distance from an inner surface of the peripheral wall becomes gradually smaller toward a bottom.

\* \* \* \* \*